United States Patent
Liang et al.

(10) Patent No.: US 11,651,956 B2
(45) Date of Patent: May 16, 2023

(54) GERMANIUM MEDIATED DE-OXIDATION OF SILICON

(71) Applicant: Psiquantum, Corp., Palo Alto, CA (US)

(72) Inventors: Yong Liang, Niskayuna, NY (US); Vimal Kumar Kamineni, Fremont, CA (US)

(73) Assignee: PSIQUANTUM, CORP., Palo Alto, CA (US)

( * ) Notice: Subject to any disclaimer, the term of this patent is extended or adjusted under 35 U.S.C. 154(b) by 0 days.

(21) Appl. No.: 17/692,977

(22) Filed: Mar. 11, 2022

(65) Prior Publication Data

US 2022/0270874 A1 Aug. 25, 2022

Related U.S. Application Data (63) Continuation of application No. 16/791,948, filed on Feb. 14, 2020, now Pat. No. 11,302,528.

(60) Provisional application No. 62/878,653, filed on Jul. 25, 2019, provisional application No. 62/878,678, filed on Jul. 25, 2019.

(51) Int. Cl.
*H01L 21/00* (2006.01)
*H01L 21/02* (2006.01)
*H01L 21/28* (2006.01)

(52) U.S. Cl.
CPC .... *H01L 21/02381* (2013.01); *H01L 21/0262* (2013.01); *H01L 21/02161* (2013.01); *H01L 21/02236* (2013.01); *H01L 21/28194* (2013.01)

(58) Field of Classification Search
CPC ......... H01L 21/02381; H01L 21/02161; H01L 21/02236; H01L 21/0262; H01L 21/28194
See application file for complete search history.

(56) References Cited

U.S. PATENT DOCUMENTS

| | | | |
|---|---|---|---|
| 5,521,108 A | 5/1996 | Rostoker et al. | |
| 6,656,792 B2 | 12/2003 | Choi et al. | |
| 2007/0047899 A1 | 3/2007 | Khang et al. | |
| 2010/0098964 A1* | 4/2010 | Ruebig | C23C 16/0218 427/535 |
| 2012/0313151 A1* | 12/2012 | Lee | H01L 21/743 257/288 |

OTHER PUBLICATIONS

U.S. Appl. No. 16/791,948, "First Action Interview Pilot Program Pre-Interview Communication", dated Jul. 27, 2021, 5 pages.
U.S. Appl. No. 16/791,948, "Notice of Allowance", dated Dec. 14, 2021, 8 pages.

\* cited by examiner

*Primary Examiner* — Richard A Booth
(74) *Attorney, Agent, or Firm* — Kilpatrick Townsend & Stockton LLP

(57) ABSTRACT

A method for removing a native oxide film from a semiconductor substrate includes repetitively depositing layers of germanium on the native oxide and heating the substrate causing the layer of germanium to form germanium oxide, desorbing a portion of the native oxide film. The process is repeated until the oxide film is removed. A subsequent layer of strontium titanate can be deposited on the semiconductor substrate, over either residual germanium or a deposited germanium layer. The germanium can be converted to silicon germanium oxide by exposing the strontium titanate to oxygen.

11 Claims, 6 Drawing Sheets

GERMANIUM MEDIATED DE-OXIDATION OF SILICON

CROSS-REFERENCES TO OTHER APPLICATIONS

This application is a continuation of U.S. patent application Ser. No. 16/791,948, filed Feb. 14, 2020; which claims priority to U.S. Provisional Patent Application No. 62/878,653, filed on Jul. 25, 2019 and to U.S. Provisional Patent Application No. 62/878,678, filed on Jul. 25, 2019, all of which are hereby incorporated by reference in their entirety for all purposes. This application is related to concurrently filed and commonly assigned U.S. patent application Ser. No. 16/791,914 for "EPITAXIAL STRONTIUM TITANATE ON SILICON" filed on Feb. 14, 2020, the disclosure of which is hereby incorporated by reference in its entirety for all purposes.

FIELD

The described embodiments relate generally to silicon-based wafers for photonic circuits. More particularly, the present embodiments relate to silicon wafers that include an epitaxial layer of $SrTiO_3$.

BACKGROUND

Currently there are a wide variety of methods to remove the native oxide, $SiO_2$, from the surface of a silicon wafer and form an epitaxial layer of $SrTiO_3$ on the wafer. Some methods use thermal desorption at high temperatures of nearly 900° C. or above to remove the amorphous $SiO_2$ layer on the silicon before depositing one or more layers that terminate in $SrTiO_3$. The use of high temperatures often results in excessive wafer bowing that can be on the order of 100 microns or greater for an 12 inch wafer. Other methods use one or more hazardous chemicals such as HF to etch the $SiO_2$, however in addition to being dangerous, this method often results in the formation of SiC on the silicon surface which is very difficult to remove and is undesirable for epitaxial growth of $SrTiO_3$. In addition, semiconductor industry has developed processes that use remote plasma of $NH_3$ and $NF_3$ gas to etch native oxide to form silicate salts that can be thermal desorbed at low-temperatures. Additionally, $NH_3$ and HF vapor phase reactions have been used to etch native oxide. However, both these methods are challenged to leave atomically clean surface of silicon. Further methods use Sr mediated de-oxidation to remove the $SiO_2$, however there is still an undesirably large lattice mismatch between the silicon and the epitaxial $SrTiO_3$ layer.

New methods for removing the native oxide from a silicon wafer and for forming an epitaxial $SrTiO_3$ layer on a silicon wafer are needed that result in reduced bow of the wafer, increased safety, reduction of the formation of undesirable species on the silicon surface (e.g., SiC) and an improved lattice match between silicon and epitaxial $SrTiO_3$.

SUMMARY

In some embodiments a method for processing a substrate comprises positioning the substrate in a deposition chamber, wherein the substrate comprises a wafer of single crystal silicon covered with a layer of amorphous silicon oxide. A layer of germanium is deposited on the layer of amorphous silicon oxide and the substrate is heated to a temperature below 850° C. causing at least a portion of the layer of amorphous silicon oxide to react with the layer of germanium to form germanium oxide.

In some embodiments the method further comprises repeating the depositing the layer of germanium and the heating the substrate until the layer of amorphous silicon oxide is removed from the wafer of single crystal silicon. In various embodiments after the amorphous silicon oxide is removed from the wafer of single crystal silicon, residual germanium from the depositing the layer of germanium is distributed on the wafer of single crystal silicon. In some embodiments an epitaxial layer of strontium titanate is deposited on the wafer of single crystal silicon and on the residual germanium.

In some embodiments the method further comprises exposing the wafer of single crystal silicon to oxygen after the depositing the epitaxial layer of strontium titanate, causing the silicon and the residual germanium to react forming a silicon germanium oxide layer between the layer of strontium titanate and the wafer of single crystal silicon. In various embodiments the method further comprises depositing a layer of germanium on the wafer of single crystal silicon after the layer of amorphous silicon oxide is removed. In some embodiments the method further comprises exposing the layer of germanium and the wafer of single crystal silicon to a temperature sufficient to cause the layer of germanium to inter-diffuse with the wafer of single crystal silicon to create a graded layer having a composition higher in silicon than germanium at the wafer of single crystal silicon and a composition that is higher in germanium than silicon at a top of the graded layer.

In some embodiments the method further comprises depositing a graded layer on the wafer of single crystal silicon after the layer of amorphous silicon oxide is removed, wherein the graded layer has a composition higher in silicon than germanium at the wafer of single crystal silicon and a composition that is higher in germanium than silicon at a top of the graded layer.

In some embodiments a method for removing an oxide layer from a substrate comprises depositing a layer of germanium on the oxide layer and heating the substrate to a temperature below 850° C. to cause the layer of germanium to react with the oxide layer and generate germanium oxide. In various embodiments the substrate comprises silicon and the oxide layer comprises silicon dioxide. In some embodiments the substrate comprises silicon germanium and the oxide layer comprises silicon germanium dioxide. In various embodiments the temperature is between 700° C. and 750° C. In some embodiments the method further comprises repetitively depositing the layer of germanium and heating the substrate until the oxide layer is removed.

In some embodiments the method further comprises depositing germanium on a surface of the substrate after the oxide layer is removed. In various embodiments the method further comprises depositing an epitaxial layer of strontium titanate after the depositing the germanium. In some embodiments the method further comprises exposing the substrate to oxygen after the depositing the epitaxial layer of strontium titanate, the oxygen causing the germanium to form a layer of silicon germanium oxide between the substrate and the epitaxial layer of strontium titanate.

In some embodiments a method for processing a substrate comprises positioning the substrate in a deposition chamber, wherein the substrate comprises a top layer of silicon germanium oxide, a middle layer of silicon germanium and a bottom layer of silicon. A layer of germanium is deposited on the layer of silicon germanium oxide and the substrate is heated to a temperature below 850° C. causing at least a portion of the layer of silicon germanium oxide to react with the layer of germanium to form germanium oxide. In various embodiments the method comprises repeating the depositing the layer of germanium and the heating the substrate until the layer of silicon germanium oxide is removed from the layer of silicon germanium.

In some embodiments the method further comprises depositing an epitaxial layer of strontium titanate on the layer of silicon germanium. In various embodiments the method of comprises exposing the layer of strontium titanate to oxygen causing the layer of silicon germanium to react with the oxygen forming a layer of silicon germanium oxide between the layer of strontium titanate and the layer of silicon.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Some embodiments of the present disclosure relate to methods for removal of the native oxide from a silicon wafer using Ge mediated de-oxidation and for the subsequent deposition of an epitaxial layer of $SrTiO_3$. Some embodiments relate to the formation of an intermediate amorphous $Si_{1-x}Ge_xO_2$ layer between the silicon and the $SrTiO_3$. While the present disclosure can be useful for a wide variety of configurations, some embodiments of the disclosure are particularly useful for forming silicon wafers for use in photonic circuits, as described in more detail below.

For example, in some embodiments a silicon wafer includes a layer of amorphous $SiO_2$ that must be removed before forming an epitaxial $SrTiO_3$ layer. A first layer of Ge can be deposited on the amorphous $SiO_2$ and can react with the $SiO_2$ when exposed to elevated temperatures in the range of 650-850° C. generating GeO that is volatile and desorbs from the Si wafer. This process can be repeated until the Si wafer is free from $SiO_2$, however some residual Ge from the process remains on the silicon surface. An epitaxial layer of $SrTiO_3$ can then be formed on the silicon surface. The wafer can then be exposed to an oxidizing atmosphere to convert the remaining Ge, now disposed between the Si and the $SrTiO_3$ layer, to amorphous $Si_{1-x}Ge_xO_2$ which is transparent to certain wavelengths of laser light.

In another example, after removal of the amorphous $SiO_2$ from the silicon surface, a graded layer of $Si_{1-x}Ge_x$ can be formed that changes concentration from a low concentration of Ge at the Si wafer interface to a higher concentration of Ge at the top of the graded layer. In some embodiments the graded layer can be formed by depositing a layer of Ge and diffusing the Ge into the surface of the Si wafer. In another embodiment, the graded layer can be formed by co-evaporating both Si and Ge with varying concentrations throughout the epitaxial growth process. A layer of epitaxial $SrTiO_3$ can then be deposited on the graded layer.

The graded layer can reduce lattice strain between the Si and the $SrTiO_3$, as the graded layer has a higher concentration of Si at the Si interface and as such has a relatively close match to the lattice of the Si. Further, the graded layer has a higher concentration of Ge at the $SrTiO_3$ interface and as such has a relatively close lattice match to the $SrTiO_3$ layer. Thus the graded layer provides an improved lattice match between the Si and the $SrTiO_3$ than if the $SrTiO_3$ were formed directly on the Si. The graded layer can be subsequently oxidized, converting it to amorphous $Si_{1-x}Ge_xO_2$ which is transparent to certain wavelengths of laser light.

In another example a Si wafer includes a pregrown epitaxial layer of $Si_{1-x}Ge_x$ that is terminated with a native oxide of $SiGeO_2$. Ge mediated de-oxidation can be used as described above, where a layer of Ge can be deposited on the $SiGeO_2$ and exposed to a high temperature to desorb the $SiGeO_2$ layer. Epitaxial $SrTiO_3$ can be deposited on the $Si_{1-x}Ge_x$ layer and the wafer can be exposed to an oxidizing atmosphere to transform the intermediate $Si_{1-x}Ge_x$ layer to $Si_{1-x}Ge_xO_2$.

In order to better appreciate the features and aspects of removing native oxide layers and forming epitaxial $SrTiO_3$ layers on silicon wafers according to the present disclosure, further context for the disclosure is provided in the following section by discussing several methods of removing native oxide layers and forming epitaxial $SrTiO_3$ layers on silicon wafers, according to embodiments of the present disclosure. These embodiments are for example only and other methods can be employed to form one or more layers of a ferroelectric oxide on a photonic wafer.

Figure 1A:
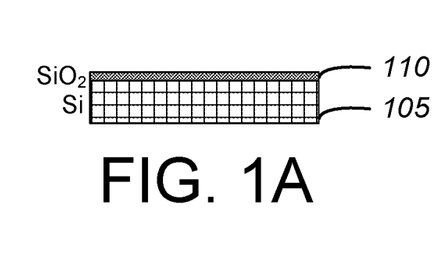
FIGS. 1A-1F illustrates simplified cross-sectional views of steps for forming a $SrTiO_3$ layer on a silicon wafer, according to embodiments of the disclosure.
Figure 1B:
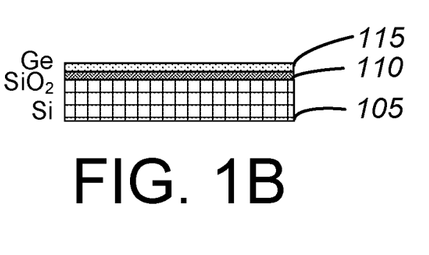
Figure 1C:
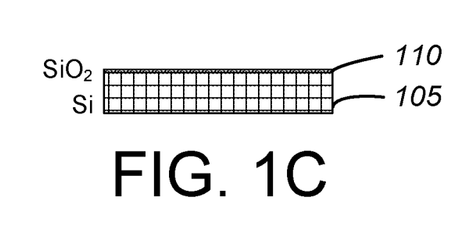
Figure 1D:
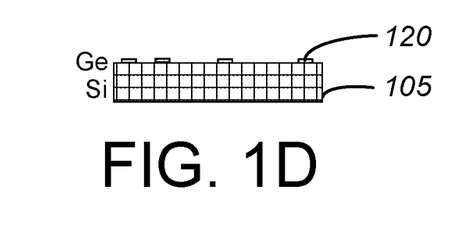
Figure 1E:
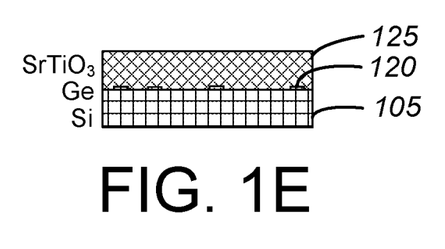
Figure 1F:
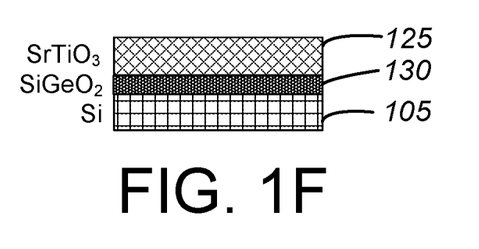
Figure 2:
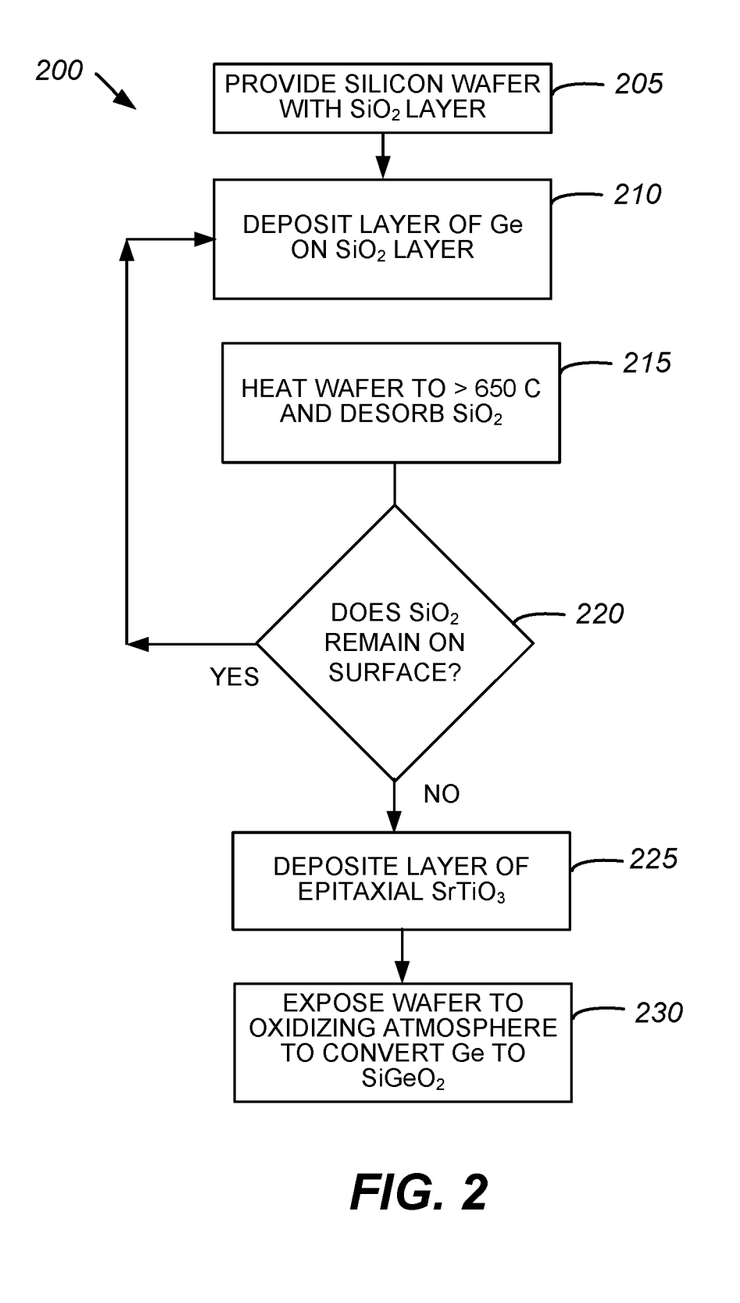
FIG. 2 is a method for forming a $SrTiO_3$ layer on a silicon wafer according to the steps illustrated in FIG. 1.

FIGS. 1A-1F illustrate simplified cross-sectional views of steps, according to a method 200 described in FIG. 2, for forming a $SrTiO_3$ layer on a silicon wafer, according embodiments of the disclosure.

As illustrated in FIG. 1A (step 205 of FIG. 2) a silicon wafer 105 that includes a layer of amorphous $SiO_2$ 110 is provided. In some embodiments silicon wafer 105 can be between 500 microns and 1000 microns thick and can have a single crystal structure.

As illustrated in FIG. 1B (step 210 of FIG. 2) a layer of Ge 115 is deposited on layer of amorphous $SiO_2$ 110. In some embodiments layer of Ge 115 can be between 0.2 to 5 nanometers thick and can be deposited via evaporation in molecular-beam epitaxy (MBE) chamber or other deposition process.

As illustrated in FIG. 1C (step 215 of FIG. 2) silicon wafer 105 can be heated to a temperature of 650-850° C. causing layer of Ge 115 to react with layer of amorphous $SiO_2$ 110 according to the reaction, $Ge+SiO_2 \rightarrow Si+GeO$. In one embodiment the temperature is between 700 and 750° C., and in another embodiment is below 850° C. In further embodiments the temperature is below 800° C., below 750°

C., or below 700° C. In yet further embodiments the temperature is below 875° C., below 900° C. or below 925° C. The resulting GeO is volatile causing layer of SiO$_2$ 110 to be removed from the top surface of silicon wafer 105.

As illustrated in FIG. 1D (step 220 of FIG. 2) the Ge deposition and subsequent reaction with SiO$_2$ and desorption of GeO can be repeated until there is no SiO$_2$ remaining on the silicon. In some embodiments in situ real time monitoring of the SiO$_2$ remaining on the silicon surface can be used to determine if all of the SiO$_2$ has been removed and whether another Ge deposition and desorption process is needed. After the last desorption process is completed, in some embodiments residual Ge 120 remains on the surface of silicon wafer 105 and may be randomly distributed across the silicon surface.

As illustrated in FIG. 1E (step 225 of FIG. 2) a layer of epitaxial SrTiO$_3$ 125 is deposited on the surface of silicon wafer 105. In some embodiments layer of SrTiO$_3$ 125 is between 0.8 nanometers and 60 nanometers thick and can be deposited using MBE. In various embodiments other thicknesses can be used. In some embodiments a Ge effusion cell can be located in a MBE tool that combines the de-oxidation and SrTiO$_3$ growth in the same tool to reduce cost and to reduce the likelihood of wafer contamination. In further embodiments, epitaxial BaTiO$_3$ can be deposited instead of SrTiO$_3$.

As illustrated in FIG. 1F (step 230 of FIG. 2) silicon wafer 105 is exposed to molecular oxygen, atomic oxygen, or ozone at a temperature above 600° C. such that the oxygen permeates SrTiO$_3$ layer 125 and oxidizes residual Ge 120 that was randomly distributed across the silicon surface. This converts residual Ge 120 to amorphous Si$_{1-x}$Ge$_x$O$_2$ 130 which is non-uniformly distributed both horizontally across silicon wafer 105 and vertically within the amorphous Si$_{1-x}$Ge$_x$O$_2$ layer, based on the location and concentration of the residual Ge that was randomly distributed across the silicon surface. The composition of Si$_{1-x}$Ge$_x$O$_2$ layer 130 can also vary due to inter-diffusion of the Si$_{1-x}$Ge$_x$O$_2$ and the silicon. The resulting Si$_{1-x}$Ge$_x$O$_2$ layer 130 is transparent at certain wavelengths that may be suitable for use in lasers, including 1550 nanometers.

In other embodiments residual Ge 120 that is randomly distributed across the silicon surface as shown in FIG. 1E can be oxidized by other species such as, but not limited to, wet oxygen, oxygen plasma and ozone. In further embodiments one or more post oxidation treatments can be employed to improve the Si$_{1-x}$Ge$_x$O$_2$ quality and interfaces, as needed.

In some embodiments a ferroelectric oxide such as, but not limited to, BaTiO$_3$, (Ba,Sr)TiO$_3$ (BST), (Pb(Zr, Ti)O$_3$ (PZT), (Pb, La)(Zr, Ti)O$_3$ (PLZT), (Sr, Ba)Nb$_2$O$_6$ (SBN) or LiNbO$_3$ can be grown on the SrTiO$_3$ layer using myriad deposition techniques, including but not limited to, MBE, CVD, PVD, PLD or sol gel. The resulting stack, ferroelectric oxide/SrTiO$_3$/Si$_{1-x}$Ge$_x$O$_2$/Si can be transparent to certain wavelengths of light, including 1550 nanometers, making the structure useful, for example, for optical switches and waveguides. In yet further embodiments, the aforementioned post oxidation process can be employed after a ferroelectric layer is grown on the SrTiO$_3$/Si$_{1-x}$Ge$_x$O$_2$/Si stack.

It will be appreciated that process 200 is illustrative and that variations and modifications are possible. Steps described as sequential may be executed in parallel, order of steps may be varied, and steps may be modified, combined, added or omitted. As would be appreciated by one of skill in the art the term "oxide" as used herein can refer to any permutation of an oxide including but not limited to monoxide, dioxide or trixoide.

Figure 3A:
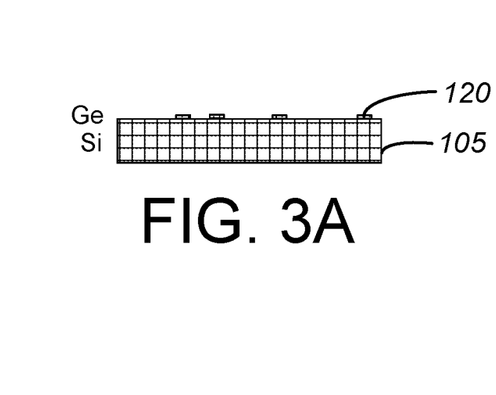
FIGS. 3A-3D illustrates simplified cross-sectional views of steps for forming a $SrTiO_3$ layer on a silicon wafer, according to embodiments of the disclosure.
Figure 3B:
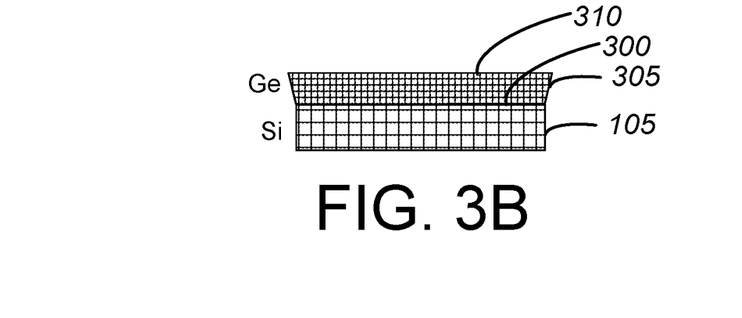
Figure 3C:
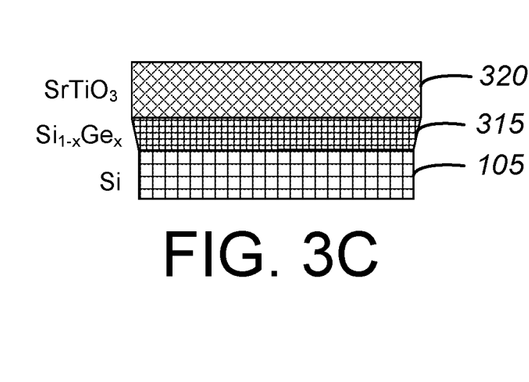
Figure 3D:
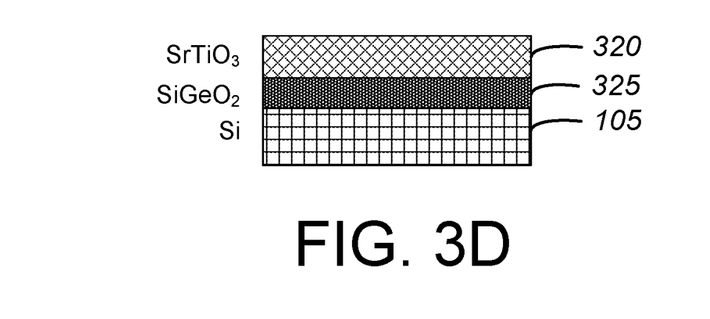
Figure 4:
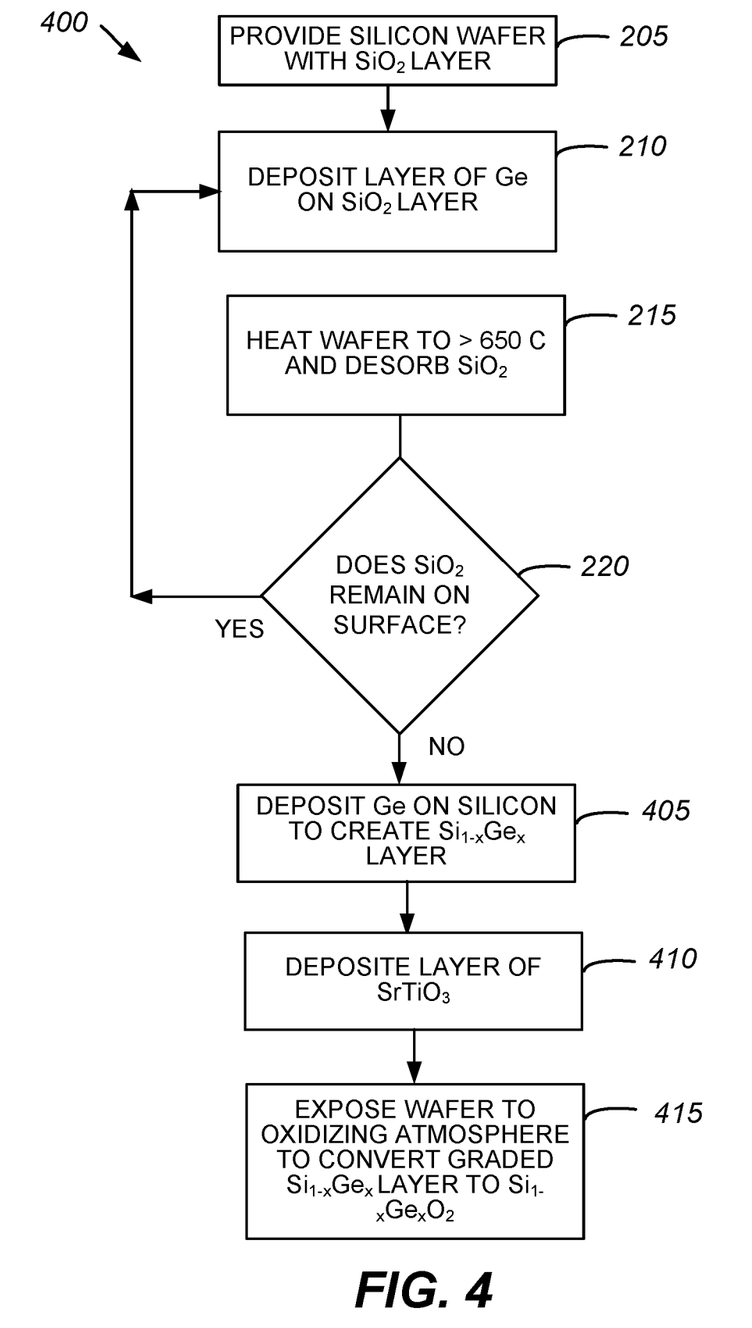
FIG. 4 is a method for forming a $SrTiO_3$ layer on a silicon wafer according to the steps illustrated in FIG. 3.

FIGS. 3A-3D illustrate simplified cross-sectional views of steps, according to a method 400 described in FIG. 4, for forming a SrTiO$_3$ layer on a silicon wafer, according embodiments of the disclosure. As shown in FIG. 4, method 400 uses a similar process as method 200, however before step 225 in method 200 in which the layer of SrTiO$_3$ is deposited, in method 400 a layer of Ge is deposited in step 405 to create a graded layer. The graded layer changes composition such that at the silicon surface the lattice has a higher percentage of silicon and has therefore closely matches the lattice of the silicon wafer and transitions to a higher percentage of Ge at the top of the layer and therefore closely matches the lattice of the subsequent SrTiO$_3$ layer, as described in more detail below.

As shown in FIG. 4, method 400 uses the same steps 205-220 as described in FIG. 2 to form a wafer that is free from amorphous SiO$_2$ and has residual Ge randomly scattered across silicon surface 300. Therefore, FIG. 3A shows a silicon wafer 105 that has residual Ge 120 randomly scattered across silicon surface 300 which results after performing steps 205-220 of FIG. 4.

As illustrated in FIG. 3B (step 405 of FIG. 4) an epitaxial layer of Ge 305 is grown on surface 300 of silicon wafer 105. In some embodiments layer of Ge 305 is between 5 to 30 nanometers thick. In some embodiments, layer of Ge 305 can be converted to a graded layer that changes from a low concentration of Ge at silicon surface 300 to a high concentration of Ge at top surface 310 of the Ge layer. In various embodiments the conversion to a graded layer is performed by diffusing Ge layer 305 and silicon wafer 105 together by exposing the wafer to a temperature between 600 and 900° C. After the diffusion process a graded Si$_{1-x}$Ge$_x$ layer is formed having a Ge concentration that varies from 0 atomic percent Ge within the bulk silicon to 100 atomic percent Ge at top surface 310 of the graded Si$_{1-x}$Ge$_x$ layer. In other embodiments, the graded layer can vary from 0 atomic percent Ge within the bulk silicon to between 30% to 40% (x from 0.3 to 0.4) atomic percent Ge at top surface 310 of the graded Si$_{1-x}$Ge$_x$ layer. One of skill in the art with the benefit of this disclosure would appreciate that other concentration gradients can be formed.

In further embodiments, instead of forming a graded Ge and Si layer by diffusing the Ge layer into the silicon, the graded Si$_{1-x}$Ge$_x$ layer can be formed on the silicon via co-evaporation of Ge and Si using Ge and Si effusion cells. During co-evaporation, the Si:Ge ratio can be adjusted as growth proceeds by changing the flux temperatures of each of the Si and Ge effusion cells.

In some embodiments the graded Si$_{1-x}$Ge$_x$ layer has a larger lattice constant than Si (40 percent Ge at Si$_{1-x}$Ge$_x$ surface resulting in approximately a 100 percent improvement in lattice match to the SrTiO$_3$ layer), leading to a high quality SrTiO$_3$ layer that is subsequently formed on the graded layer, as described below.

As illustrated in FIG. 3C (step 410 of FIG. 4) an epitaxial layer of SrTiO$_3$ 320 can be subsequently deposited on graded Ge layer 315. In some embodiments layer of SrTiO$_3$ 320 is between 0.8 to 60 nanometers thick and can be deposited using MBE. In other embodiments, epitaxial BaTiO$_3$ can be grown directly on Si$_{1-x}$Ge$_x$ layer 315 using MBE.

As illustrated in FIG. 3D (step 415 of FIG. 4) the wafer is exposed to molecular oxygen, atomic oxygen, or ozone at a temperature above 600° C. such that the oxygen permeates SrTiO$_3$ layer 320 and oxidizes graded Si$_{1-x}$Ge$_x$ layer 315 (see FIG. 3C), forming a Si$_{1-x}$Ge$_x$O$_2$ layer 325 that is transparent to certain wavelengths of light, including 1550 nanometers. Therefore the entire stack can be useful, for example, for optical switches and waveguides. As described above with regard to FIGS. 1A-1D and method 200 in FIG. 2, in some embodiments one or more alternative oxidation processes can be used, different ferroelectric oxides can be deposited on the graded layer and optional post oxidation processes can also be used.

It will be appreciated that process 400 is illustrative and that variations and modifications are possible. Steps described as sequential may be executed in parallel, order of steps may be varied, and steps may be modified, combined, added or omitted.

Figure 5A:
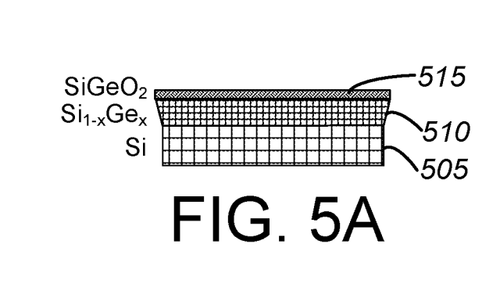
FIGS. 5A-5F illustrates simplified cross-sectional views of steps for forming a $SrTiO_3$ layer on a silicon wafer that includes a silicon germanium layer, according to embodiments of the disclosure.
Figure 5B:
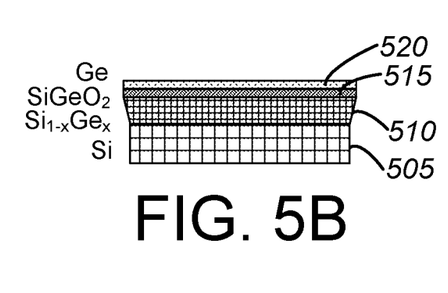
Figure 5C:
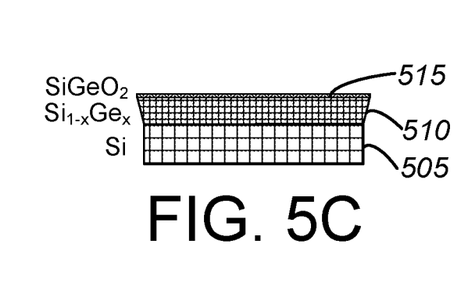
Figure 5D:
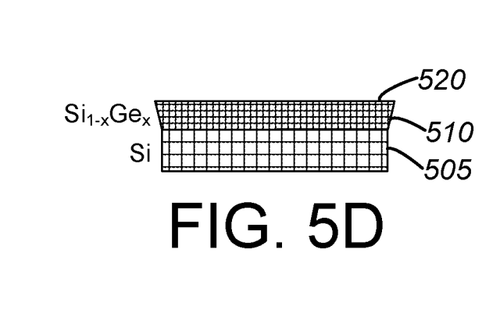
Figure 5E:
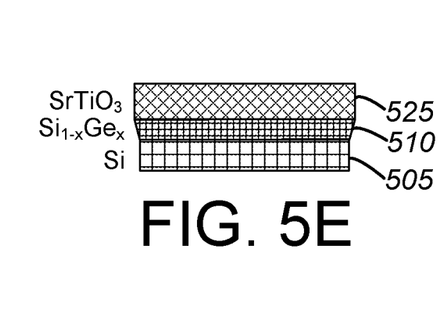
Figure 5F:
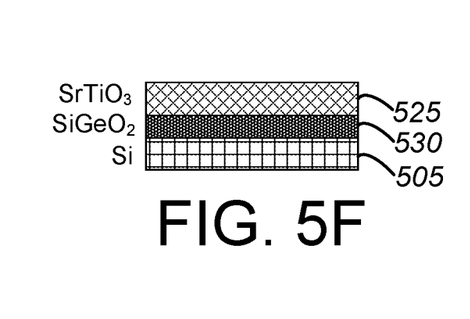
Figure 6:
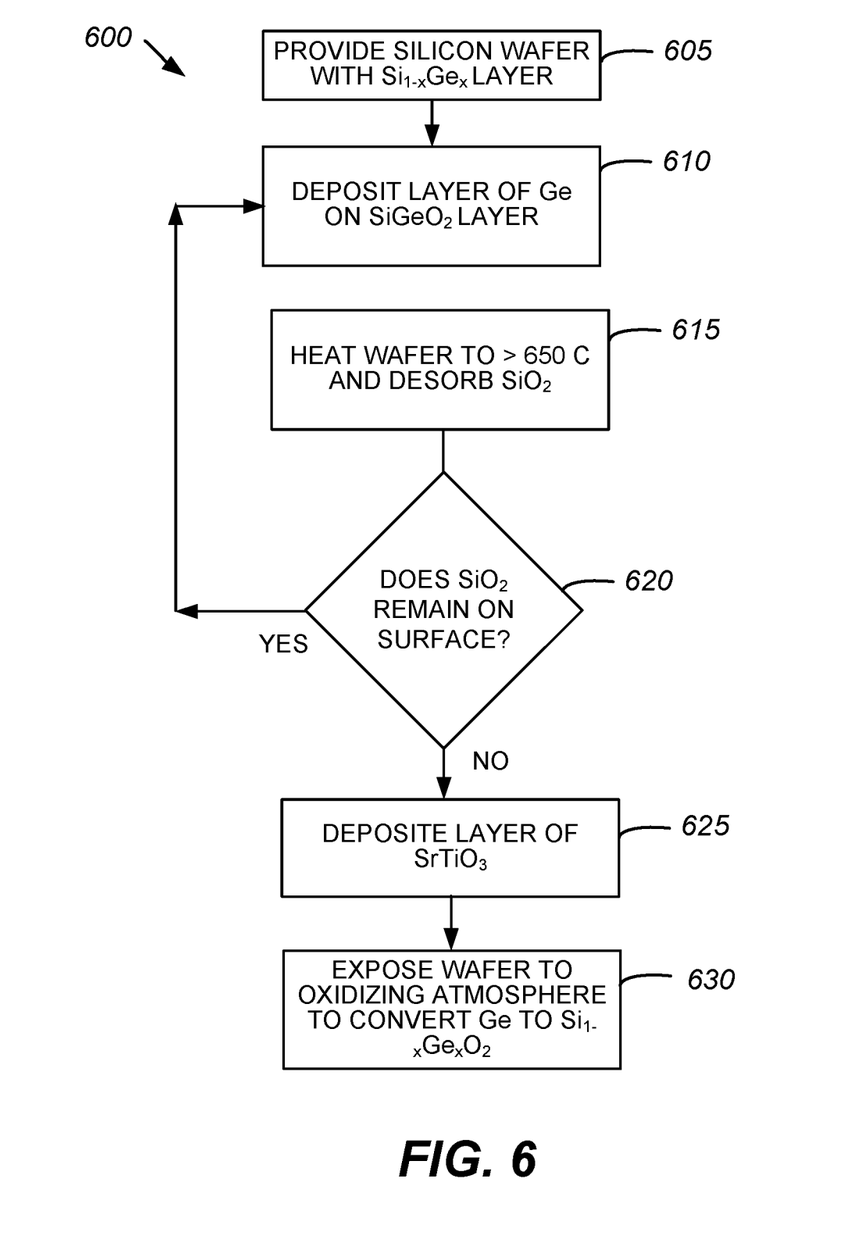
FIG. 6 is a method for forming a $SrTiO_3$ layer on a silicon wafer according to the steps illustrated in FIG. 5.

FIGS. 5A-5F illustrate simplified cross-sectional views of steps, according to a method 600 described in FIG. 6, for forming a SrTiO$_3$ layer on a silicon wafer, according embodiments of the disclosure. As shown in FIG. 6, method 600 starts with a silicon wafer 505 having a SiGe layer 510 terminated with a SiGeO$_2$ surface layer 515 that is removed before a layer of SrTiO$_3$ is deposited, as described in more detail below.

As illustrated in FIG. 5A (step 605 of FIG. 6) a silicon wafer 505 includes an epitaxial Si$_{1-x}$Ge$_x$ layer 510 terminated with a native oxide layer of amorphous SiGeO$_2$ 515. In various embodiments Si$_{1-x}$Ge$_x$ layer 510 can be graded (e.g., can change concentration vertically within the layer as described in previous embodiments herein) while in other embodiments the Si$_{1-x}$Ge$_x$ layer can be of uniform concentration. In some embodiments silicon wafer 505 can be between 500 microns and 1000 microns thick and can have a single crystal structure.

As illustrated in FIG. 5B (step 610 of FIG. 6) a layer of Ge 520 is deposited on SiGeO$_2$ layer 515. In some embodiments layer of Ge 520 can be between 0.2 to 5 nanometers thick and can be deposited via an evaporation or other deposition process.

As illustrated in FIG. 5C (step 615 of FIG. 6) the wafer can be heated to a temperature >650° C. causing layer of Ge 520 to react with layer of SiGeO$_2$ 515 according to the reaction, Ge+SiO$_2$→Si+GeO. In some embodiments the temperature may be different as described in step 215 of FIG. 2. The resulting GeO is volatile causing at least a portion of layer of SiGeO$_2$ 515 to be desorbed from the surface of silicon wafer 505.

As illustrated in FIG. 5D (step 620 of FIG. 6) the Ge deposition, subsequent reaction with SiO$_2$ and desorption of GeO can be repeated until there is no SiGeO$_2$ remaining on the wafer. In some embodiments in situ real time monitoring of the SiGeO$_2$ remaining on the wafer surface can be used to determine if all of the SiGeO$_2$ has been removed and whether additional Ge deposition and desorption processes are needed. After the last desorption process is completed, the wafer has an oxide free top surface 520 of layer of Si$_{1-x}$Ge$_x$ 510.

As illustrated in FIG. 5E (step 625 of FIG. 6) a layer of epitaxial SrTiO$_3$ 525 is deposited on layer of Si$_{1-x}$Ge$_x$ 510. In some embodiments layer of SrTiO$_3$ 525 is between 0.8 and 60 nanometers thick and can be deposited using MBE or another suitable deposition process.

As illustrated in FIG. 5F (step 630 of FIG. 6) the wafer is exposed to molecular oxygen, atomic oxygen, or ozone at a temperature above 600° C. such that the oxygen permeates layer of SrTiO$_3$ 525 and oxidizes the underlying layer of Si$_{1-x}$Ge$_x$ 510. The oxygen converts layer of Si$_{1-x}$Ge$_x$ 510 to a layer of Si$_{1-x}$Ge$_x$O$_2$ 530 which is transparent at certain wavelengths that may be suitable for use in lasers, including 1550 nanometers. As described above with regard to FIGS. 1A-D and method 200, in some embodiments one or more alternative oxidation processes can be used, different ferroelectric oxides can be deposited on layer of Si$_{1-x}$Ge$_x$ 510, and alternative post oxidation processes can also be used.

It will be appreciated that process 600 is illustrative and that variations and modifications are possible. Steps described as sequential may be executed in parallel, order of steps may be varied, and steps may be modified, combined, added or omitted.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A method for processing a substrate, the method comprising:
    positioning the substrate in a deposition chamber, wherein the substrate comprises a top layer of silicon germanium oxide, a middle layer of silicon germanium and a bottom layer of silicon;
    depositing a layer of germanium on the top layer of silicon germanium oxide; and
    heating the substrate to a temperature below 850° C., thereby causing at least a portion of the top layer of silicon germanium oxide to react with the layer of germanium to form germanium oxide.

2. The method of claim 1 wherein the middle layer of silicon germanium is graded.

3. The method of claim 1 wherein the temperature is above 650° C.

4. The method of claim 1 wherein the germanium oxide is formed in accordance with the equation Ge+SiO$_2$→Si+GeO.

5. The method of claim 1 further comprising repeating the depositing the layer of germanium and the heating the substrate until the top layer of silicon germanium oxide is removed from the middle layer of silicon germanium.

6. The method of claim 5 further comprising monitoring the top layer of silicon germanium oxide during removal of the top layer of silicon germanium oxide.

7. The method of claim 6 wherein the monitoring is performed in situ and real-time.

8. The method of claim 5 further comprising depositing an epitaxial layer of strontium titanate on the middle layer of silicon germanium.

9. The method of claim 8 wherein the epitaxial layer of strontium titanate is characterized by a thickness between 0.8 and 60 nanometers.

10. The method of claim 8 further comprising exposing the epitaxial layer of strontium titanate to oxygen, thereby causing the middle layer of silicon germanium to react with the oxygen to form a layer of silicon germanium oxide between the epitaxial layer of strontium titanate and the bottom layer of silicon.

11. The method of claim 10, wherein exposing the epitaxial layer of strontium titanate to oxygen is performed at an oxidizing temperature above 600° C.

\* \* \* \* \*